US012177969B2

(12) United States Patent
Hodges et al.

(10) Patent No.: US 12,177,969 B2
(45) Date of Patent: Dec. 24, 2024

(54) MODULAR ELECTRONIC PROTOTYPING PLATFORMS

(71) Applicant: Microsoft Technology Licensing, LLC, Redmond, WA (US)

(72) Inventors: Stephen Edward Hodges, Cambridge (GB); Michal J. Moskal, Seattle, WA (US); Gabriele D'Amone, Cambridge (GB); James Alexander Devine, Cambridge (GB); Thomas Jaudon Ball, Mercer Island, WA (US); Jonathan Paul De Halleux, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 224 days.

(21) Appl. No.: 17/849,305

(22) Filed: Jun. 24, 2022

(65) Prior Publication Data

US 2023/0389175 A1 Nov. 30, 2023

Related U.S. Application Data

(60) Provisional application No. 63/346,710, filed on May 27, 2022.

(51) Int. Cl.
*H05K 1/02* (2006.01)
*H05K 1/18* (2006.01)
*H05K 3/30* (2006.01)

(52) U.S. Cl.
CPC ........... *H05K 1/0287* (2013.01); *H05K 1/181* (2013.01); *H05K 3/306* (2013.01); *H05K 2201/09954* (2013.01); *H05K 2201/1034* (2013.01)

(58) Field of Classification Search
CPC ...... H05K 1/0287; H05K 1/181; H05K 3/306; H05K 2201/09954; H05K 2201/1034
(Continued)

(56) References Cited

U.S. PATENT DOCUMENTS 8,708,323 B2 * 4/2014 Hoyt ................... B23B 31/1078
248/346.03
10,603,750 B1 * 3/2020 Taylor .................. B23Q 1/0072
(Continued)

FOREIGN PATENT DOCUMENTS

RU 2631122 * 9/2017

OTHER PUBLICATIONS

U.S. Appl. No. 17/852,698, filed Jun. 29, 2022.
(Continued)

*Primary Examiner* — Timothy J Thompson
*Assistant Examiner* — Michael F McAllister
(74) *Attorney, Agent, or Firm* — Rainier Patents, P.S.

(57) ABSTRACT

The description relates to electronic prototyping platforms. One example can include an electrically insulative substrate having generally opposing first and second major surfaces and that includes an orientation feature that is visible on both of the first and second major surfaces. The example can include a first mounting hole through the substrate that is bordered by a first electrical conductor associated with data transmission. The example can also include a second mounting hole through the substrate that is bordered by a second electrical conductor associated with electrical ground, and a third mounting hole through the substrate that is bordered by a third electrical conductor associated with electrical power. The example can also include an edge connector tab defined by the substrate and having three exposed electrically conductive contacts that are coupled to the data electrical
(Continued)

conductor, the ground electrical conductor, and the power electrical conductor and insulated from one another.

20 Claims, 13 Drawing Sheets

(58) Field of Classification Search
USPC .......................................................... 174/254
See application file for complete search history.

(56) References Cited

U.S. PATENT DOCUMENTS

| | | | |
|---|---|---|---|
| 2013/0102937 A1 | 4/2013 | Ehrenreich | |
| 2017/0194721 A1 | 7/2017 | Fan | |
| 2018/0126175 A1* | 5/2018 | Seitz | H01G 4/35 |
| 2020/0300598 A1 | 9/2020 | Kim | |
| 2020/0335432 A1* | 10/2020 | Murtagian | H01L 21/67144 |
| 2021/0037684 A1 | 2/2021 | Kwak | |
| 2021/0270431 A1 | 9/2021 | John | |
| 2022/0260805 A1* | 8/2022 | Ready | G02B 7/1827 |
| 2024/0006833 A1 | 1/2024 | Hodges | |
| 2024/0008174 A1 | 1/2024 | Hodges | |

OTHER PUBLICATIONS

U.S. Appl. No. 17/852,726, filed Jun. 29, 2022.

"25 Pairs 3.0MM Bullet Banana Plug Male & Female Connectors RC Model Parts for ESC Motor Lipo Battery Gold-plated", Retrieved from: https://www.amazon.co.uk/gp/product/B094N5FF2T/ref=ppx_yo_dt_b_asin_image_007_s00?th=1, May 11, 2021, 2 Pages.

"Copper Alloy Push Pins with Compression Springs", Retrieved from: https://web.archive.org/web/20201031175434/http://www.rego.com.tw/product_detail.php?prdt_id=247, Oct. 31, 2020, 2 Pages.

"Jacdac", Retrieved from: https://web.archive.org/web/20220317005444/https://microsoft.github.io/jacdac-docs/, Mar. 17, 2022, 8 Pages.

Lambrichts, et al., "A Survey and Taxonomy of Electronics Toolkits for Interactive and Ubiquitous Device Prototyping", In Proceedings of the ACM on Interactive, Mobile, Wearable and Ubiquitous Technologies, vol. 5, Issue 2, Jun. 2021, 24 Pages.

Non-Final Office Action mailed on Sep. 5, 2024, in U.S. Appl. No. 17/852,698, 18 pages.

* cited by examiner

MODULAR ELECTRONIC PROTOTYPING PLATFORMS

PRIORITY

This patent application is a utility application claiming priority to U.S. Provisional Application 63/346,710, filed on May 27, 2022, which is incorporated by reference herein in its entirety.

BACKGROUND

In the electronic device realm, many ideas may be tested before a successful solution is identified. Electronics prototyping platforms are designed to support quick exploration and iteration of the numerous ideas.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

DESCRIPTION

The present concepts relate to modular electronics prototyping systems or platforms. Electronics prototyping platforms are designed to support quick exploration and iteration of ideas, typically resulting in an artefact that runs on the bench to demonstrate aspects of the operation of a device configuration. However, when an idea shows promise it is hard to move to the next stage of development. For example, the prototype may not be suitable for real-world deployment to support more realistic or comprehensive testing because it is too fragile, unreliable, and/or too bulky. Similarly, the prototype may be fiddly, time-consuming and/or expensive to replicate should more of them be needed for more extensive evaluation. The present concepts offer a technical solution to these and/or other technical problems.

The present concepts can be implemented on a prototyping platform or system that can include modules upon which an electronic functionality, such as a light or a sensor can be positioned. Multiple modules can be joined via a breadboard to achieve a desired overall functionality. For instance, the light of one module can be powered on or powered off depending on the output of the sensor on another module on the breadboard. These aspects are described in more detail below relative to the examples of FIGS. 1A-2B.

Figure 1A:
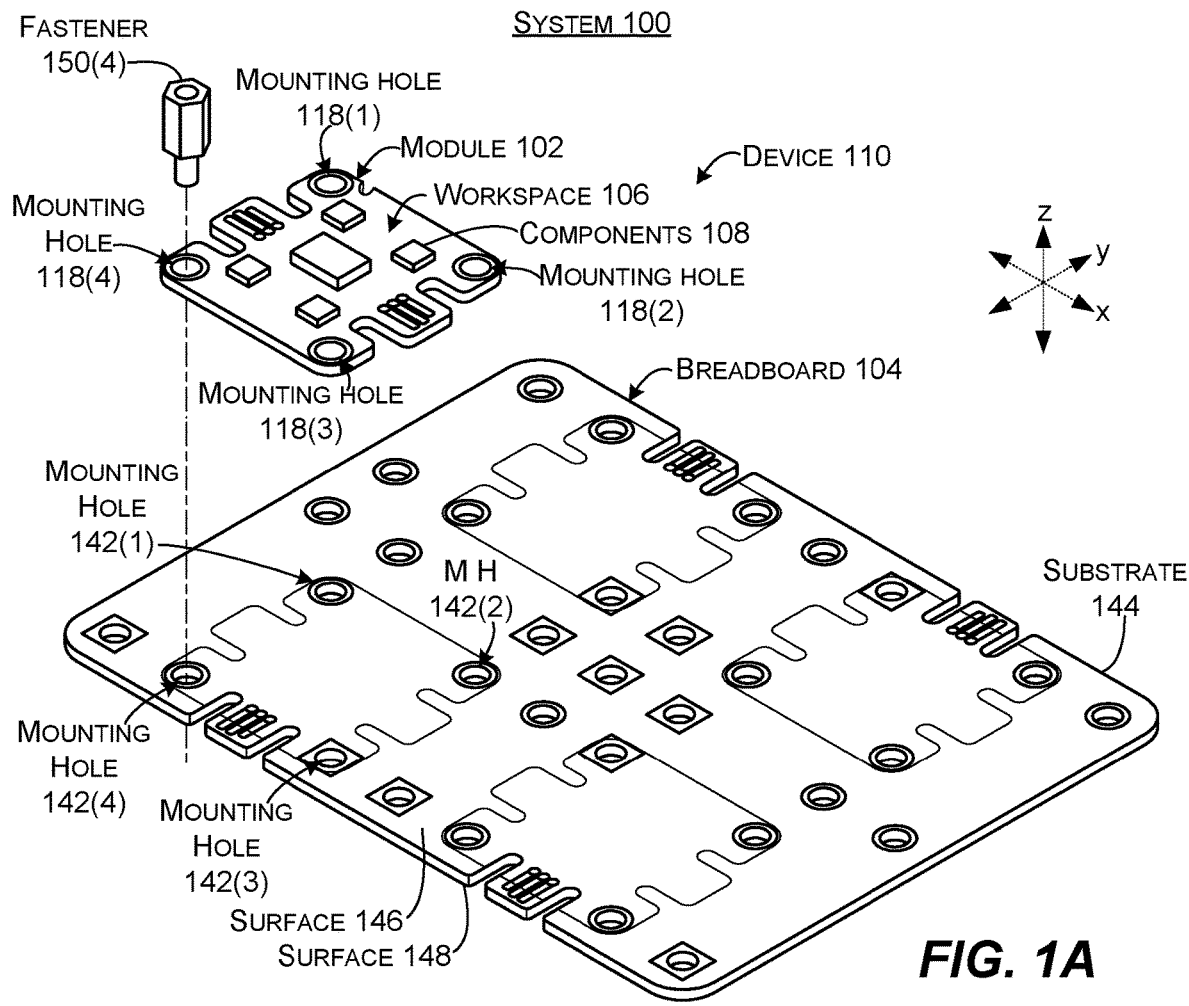
FIGS. 1A-1D, 5A, 5B, 6A, and 6B show perspective views of example devices in accordance with some implementations of the present concepts.
Figure 1B:
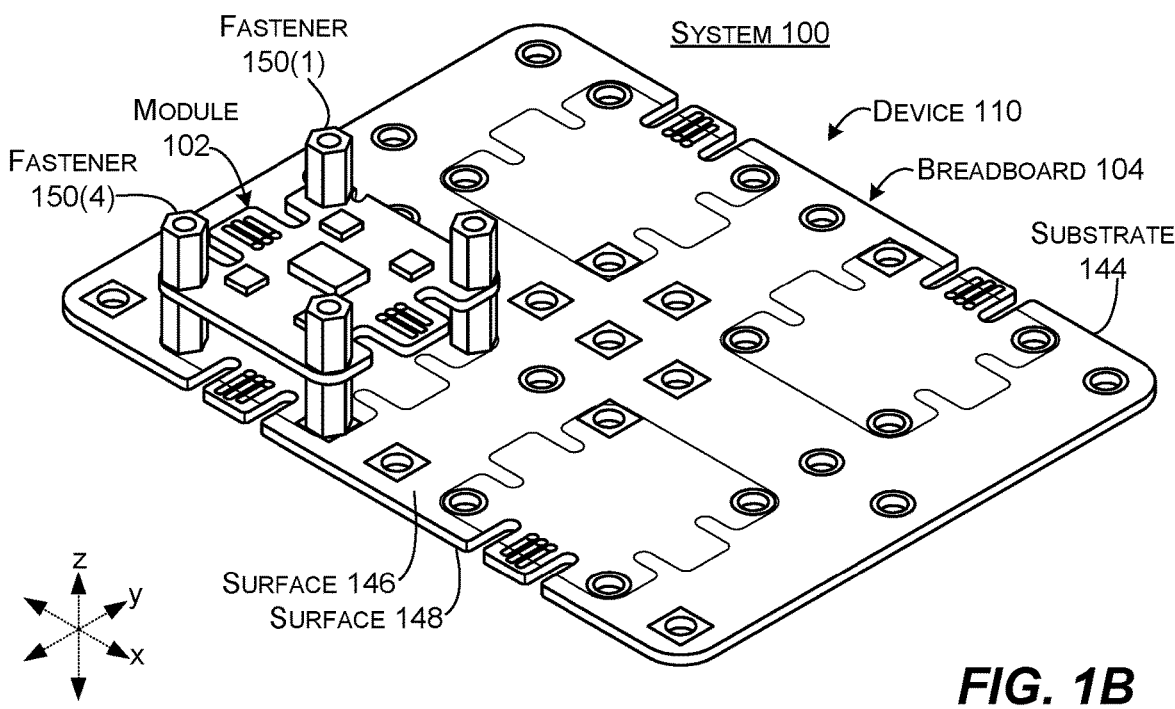
Figure 1C:
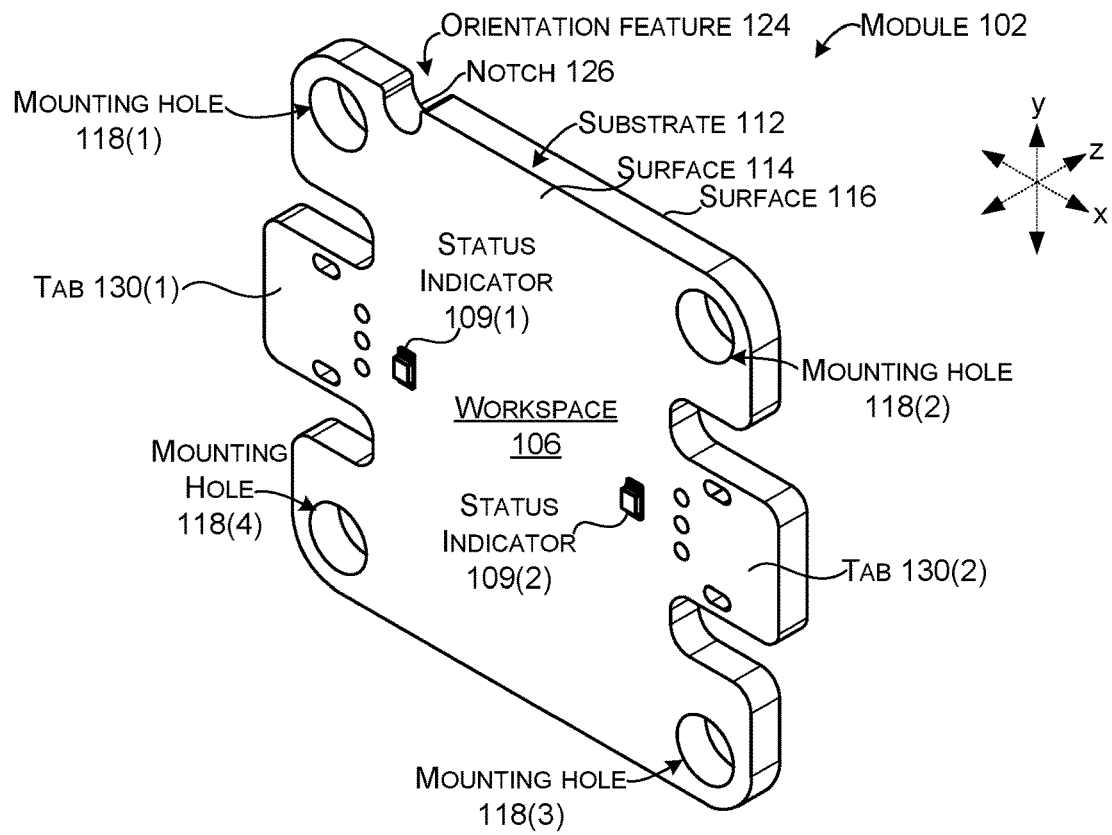
Figure 1D:
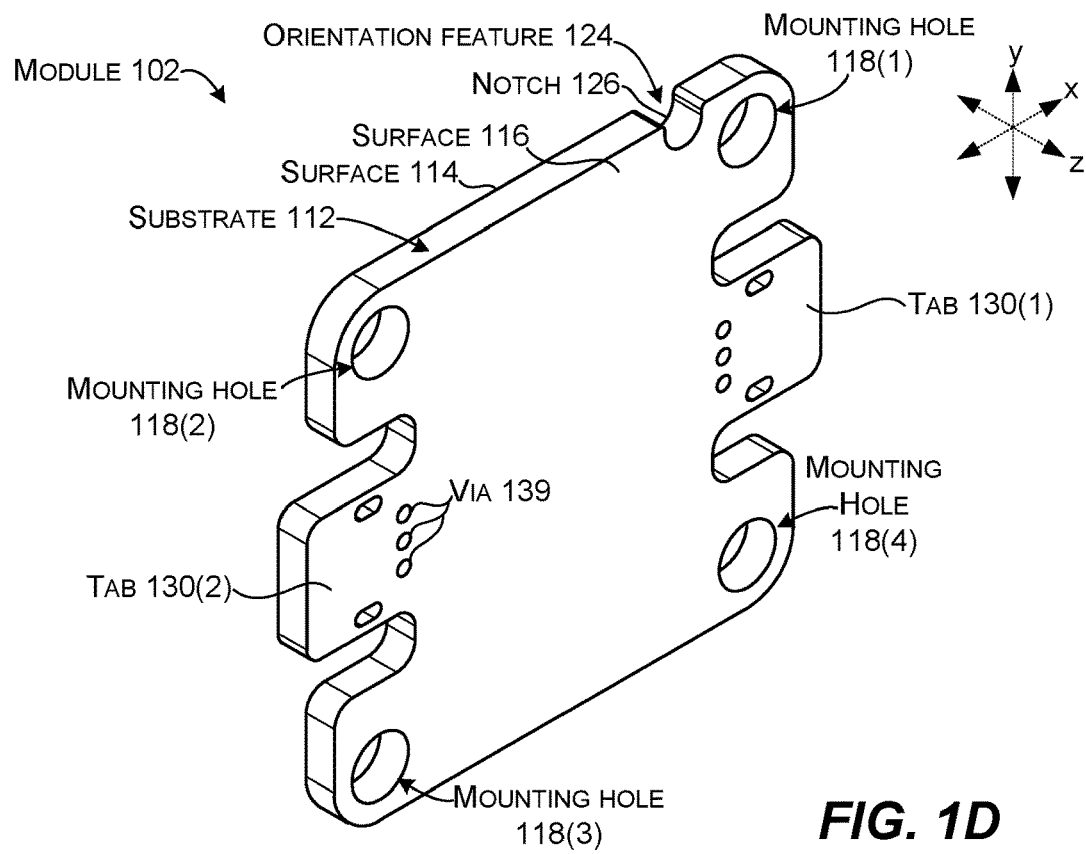

FIGS. 1A-1I collectively show an example system 100. The system can include modules 102 and/or breadboards 104. FIG. 1A shows an individual module 102 prepared for fastening to (e.g., mounting on) the breadboard 104. FIG. 1B shows the individual module 102 fastened to the breadboard 104.

The modules 102 can include and/or relate to workspaces 106, components 108, status indicators 109, devices 110, substrate 112, surfaces 114 and 116, mounting holes 118, rectangular shape 120, rectangular shape 122, orientation features 124, notches 126, perimeters 128, tabs 130, indents 132, tips 134, contacts 136, buses 138, and/or contacts 140, among others.

The breadboards 104 can include mounting holes 142 extending through a substrate 144 from a first major surface 146 to a second major surface 148. Fasteners 150 can extend through mounting holes 118 and 142 to both mechanically secure and electrically connect the modules 102 and the breadboards 104. The elements are described in more detail below relative to FIGS. 1A-1I, 2A, and 2B collectively and in some cases, relative to individual figures.

The module 102 can include workspace 106 where various electronic components 108, such as lights, sensors, resistors, diodes, transistors, switches, etc. can be positioned. The workspace 106 can also include status indicators 109 (FIG. 1C) relating to the electronic components 108 and/or the module 102. Multiple modules 102 can be interconnected, such as on breadboards 104 to create a device 110 that includes the combined functionalities of the electronic components 108 on a single module or across multiple modules. (Note that these figures illustrate a large number of elements. In order to avoid clutter on the drawing page, not every instance of every element is labeled with specificity on each figure.)

The modules 102 can include an electrically insulative substrate 112. The electrically insulative substrate 112 can be formed from various materials, such as polymers and/or laminates, for example. The electrically insulative substrate 112 can have generally opposing first and second major surfaces 114 and 116 that lie parallel to the xy reference plane and are separated by a thickness in the z reference direction. This aspect is visualized in the complementary opposing views of the first major surface 114 and the second major surface 116 in FIGS. 1C and 1D.

Figure 1E:
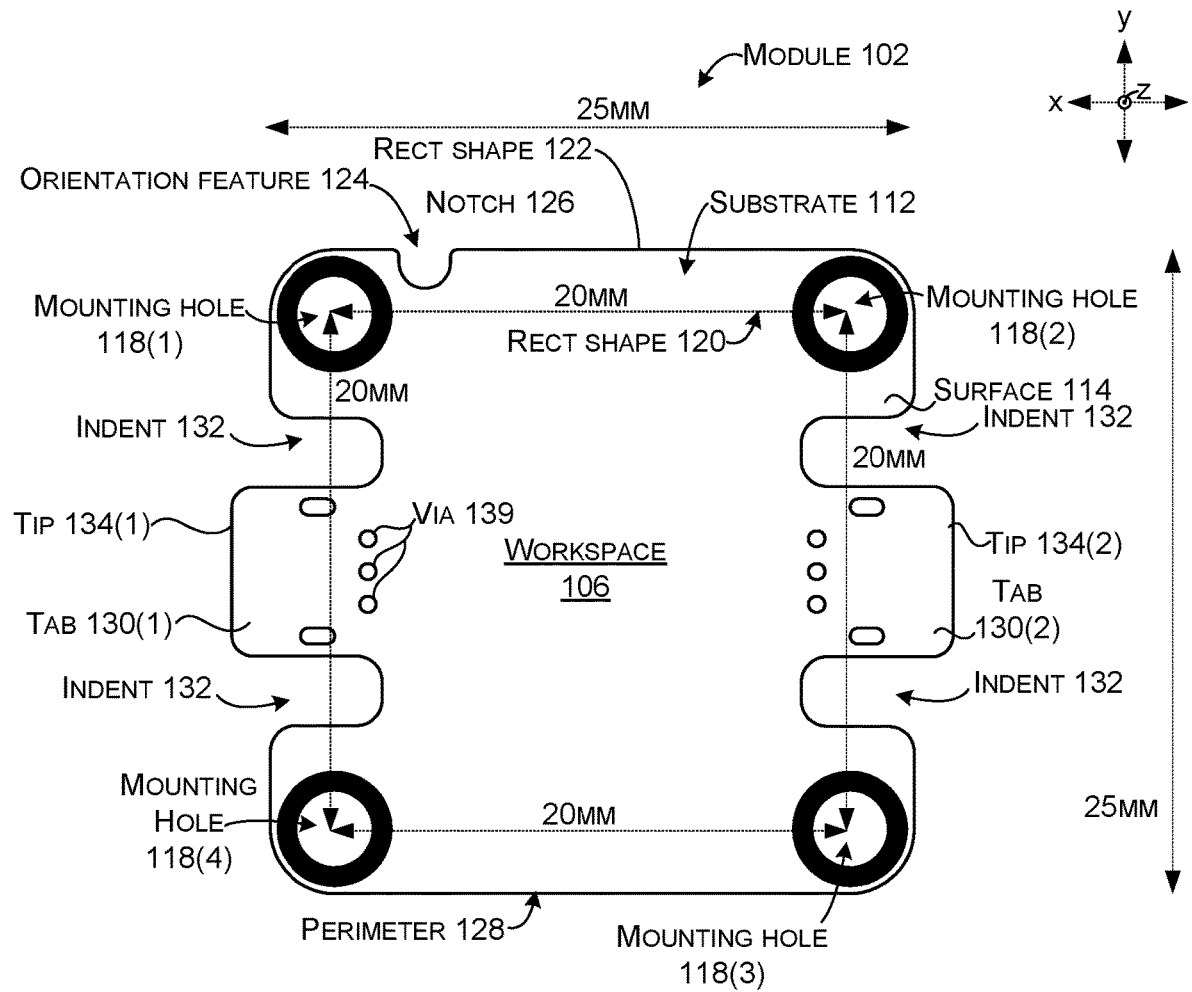
FIGS. 1E-1I, 2A, 2B, 4A, 4C, 4E, 4G, and 7 show elevational views of example devices in accordance with some implementations of the present concepts.

Mounting holes 118 can extend through the electrically insulative substrate 112 between the first and second surfaces 114 and 116. In this case, four mounting holes 118 are arranged to define corners of a rectangular shape 120 (e.g., in a rectangular pattern). For instance, the first three mounting holes could be in an "L" shape (e.g., collectively define a right angle). The fourth mounting hole, when employed can complete a rectangular shape. This aspect is shown in FIG. 1E. Other implementations with the mounting holes arranged in different configurations are contemplated.

The mounting holes 118 can be spaced apart by a given pitch or multiples of a common or given pitch. For instance, in this example the pitch can be 10 millimeters. For example, mounting holes 118(1) and 118(4) can be 10 millimeters apart and mounting holes 118(1) and 118(2) can be 10 millimeters apart (e.g., square configuration) or mounting holes 118(1) and 118(4) (e.g., shorter side) can be 10 millimeters apart and 118(1) and 118(2) (e.g., longer side) can be 20 millimeters apart (e.g., rectangular configuration with width of 10 mm and length of 20 mm), for example. In the illustrated configuration shown in FIG. 1E, mounting holes 118(1) and 118(2) are 20 millimeters (e.g., pitch of 10 multiplied by whole number, which in this case is 2) apart and mounting holes 118(1) and 118(4) are 20 millimeters apart (e.g., pitch of 10 multiplied by whole number, which in this case is 2).

The electrically insulative substrate 112 can also have dimensions that relate to the pitch of the mounting holes 118. For instance, in this case, the dimensions of the electrically insulative substrate 112 can equal the dimensions of the rectangular configuration of the mounting holes plus ½ (0.5) multiplied by the pitch (e.g., 10 mm pitch33 0.5=5 millimeters in this example). Thus, if the dimensions of the rectangular shape 120 defined by the mounting holes is 10 millimeters by 20 millimeters, the dimensions of a rectangular shape 122 of the electrically insulative substrate 112 can be 15 millimeters by 25 millimeters. In the illustrated mounting hole spacing of 20×20, the dimensions of the rectangular shape 122 of the electrically insulative substrate 112 can be 25 millimeters by 25 millimeters. Other shapes and sizes are contemplated.

The electrically insulative substrate 112 can include orientation feature 124 that is visible on both the first and second major surfaces 114 and 116. In this case, the orientation feature 124 is manifest as a notch 126 located on a perimeter 128 of the electrically insulative substrate 112. In this implementation, the orientation is intended to be positioned at the top left (e.g., at the 11 o'clock position). In another case, the orientation feature 124 could be a distinctive shape, such as a star shape or an arrow defined relative to the substrate so that the user can orient the substrate with the orientation feature 124 at a specified location. For instance, in one example, the star shape orientation feature could be printed on, imprinted into, and/or formed through the substrate to provide an unambiguous point of reference for the user to aid in orienting the module. This aspect will be discussed in more detail below. Stated another way, the orientation feature is not centered or otherwise positioned along a line that bifurcates the electrically insulative substrate 112 into two identical halves or otherwise creates ambiguity for the user in how to orient the module.

The electrically insulative substrate 112 can also include one or more edge connector tabs 130. For instance, a single edge connector tab or multiple edge connector tabs could be positioned along a single side of the substrate 112. The illustrated implementation includes opposing edge connector tabs 130(1) and 130(2). The edge connector tabs 130 can be separated from the mounting holes 118 by indents 132 in the electrically insulative substrate 112. In some implementations, tips 134 of the edge connector tabs 130 can be at or within the perimeter 128 of the rectangular shape 122 of the substrate 112. In other configurations, such as the illustrated implementation, tips 134 of edge connector tabs 130 can extend beyond the rectangular shape 122 of the electrically insulative substrate 112. The indents 132 and/or tips 134 can facilitate coupling other assemblies to the module 102.

Figure 1F:
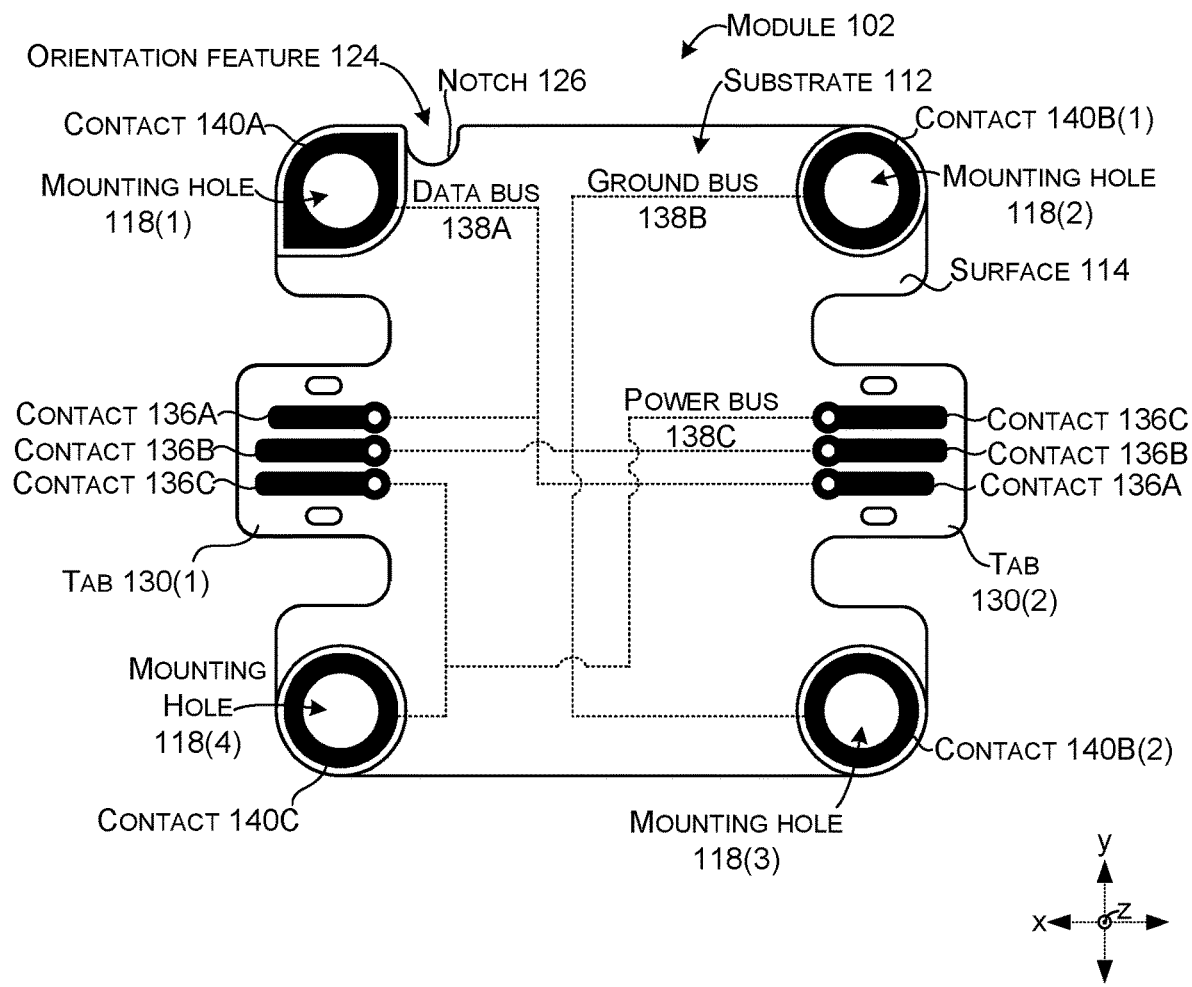

As indicated on FIG. 1F, each edge connector tab 130 can include three exposed electrically conductive contacts 136. In this case, contact 136A is a data contact, contact 136B is a ground contact, and contact 136C is a power contact. Contact 136A is connected to data bus 138A, contact 136B is connected to ground bus 138B, and contact 136C is connected to power bus 138C. Note that buses 138 are illustrated in ghost to indicate that they would likely not be visible in this view. For instance, they could be located within the substrate 112 and/or positioned on top of the substrate and covered with a protective insulative layer, among other configurations.

Note that contacts 136 can be positioned on a single side of the substrate 112 (e.g., either major surface 114 or major surface 116). Alternatively, the contacts 136 can be positioned on both sides (e.g., on both major surfaces 114 and 116) of the tabs 130. In this implementation, vias 139 (labeled FIGS. 1D and 1E) allow conductors to extend through the substrate to electrically connect the contacts 136 on the opposing major surfaces 114 and 116.

Contacts 140 are positioned around the mounting holes 118. In this configuration contact 140A is positioned around mounting hole 118(1), contact 140B(1) is positioned around mounting hole 118(2), contact 140B(2) is positioned around mounting hole 118(3), contact 140C is positioned around mounting hole 118(4). Contact 140A is connected to bus 138A, contacts 140B(1) and 140B(2) are connected to bus 138B, and contact 140C is connected to bus 138C. Thus, contacts 136A and 140A are connected via bus 138A and electrically insulated from the other contacts, contacts 136B and 140B are connected via bus 138B and electrically insulated from the other contacts, and contacts 136C and 140C are connected via bus 138C and electrically insulated from the other contacts.

Figure 1G:
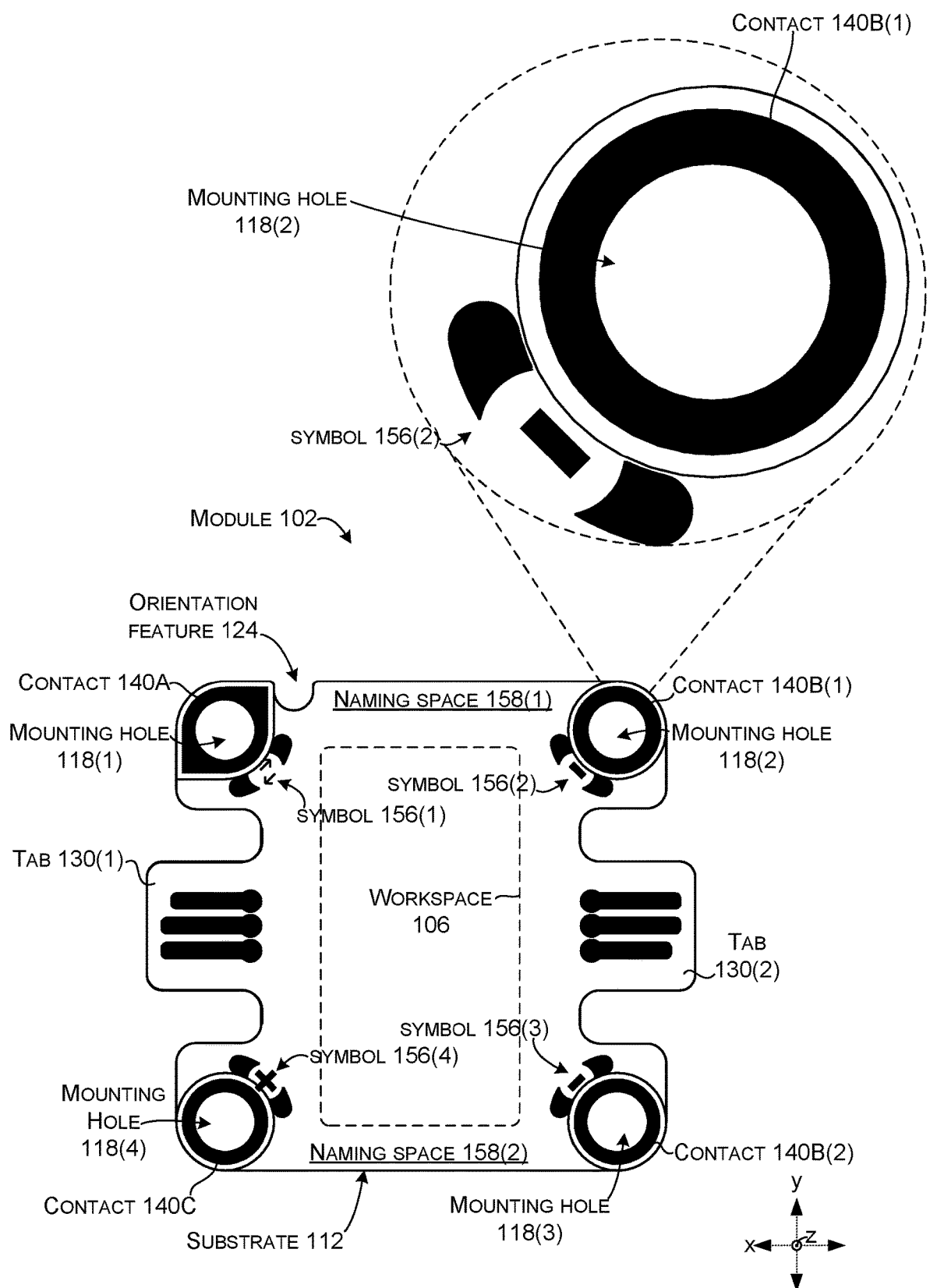

FIG. 1G shows examples of how the orientation feature 124 can guide device usability features. In this example, numbering and identification information can be employed relative to the orientation feature 124. For instance, numbering for component identification, to promote proper circuit completion, and/or avoid short circuits can be based upon reference to the orientation feature 124. For example, the mounting holes 118 can be referenced from the orientation feature 124. For instance, mounting hole 118(1) is closest to the orientation feature 124 and thus receives the designator "(1)." The designators can then be assigned in a clockwise manner (e.g., "(1)," "(2)," "(3)," and "(4)." Similarly, tab 130(1) is proximate to the orientation feature and thus can be assigned the initial value of "(1)" (or "0" depending on the numbering convention employed). Remaining tabs (in this case tab 130(2)) are assigned values in clockwise occurrence from the first tab.

The description now relates to several example visual aids that can be supplied on the modules. These visual aids are explained relative to areas or zones 152 and 154, as well as symbols 156, and naming spaces 158.

FIG. 1G also shows example module 102 and how symbolic aids can be employed to assist the user to establish proper electrical connections. In this case, symbol 156 can be positioned proximate to individual mounting holes 118 to indicate which contact 140 (and hence bus 138) the individual mounting holes are associated with. The symbols 156 can be oriented and located to be discernable by the user when the orientation feature 124 is oriented at the intended orientation (e.g., in this case at the upper left or 11 o'clock position). In this example, symbol 156(1) entails overlapping parallel but oppositely oriented arrows to represent 'data.' Symbols 156(2) and 156(3) entail a negative symbol to represent 'ground.' Symbol 156(4) entails a positive symbol to represent 'power.' Other symbols, symbol location, and symbol orientations are contemplated. For instance, names or other helpful description or nomenclature can be added to the module outside of the workspace 106 and can be oriented so that it is presented to the user in a standard left to right manner when the orientation feature 124 is oriented as intended (for instance at the top left or 11 o'clock position in this example). Two such examples are shown as 'naming space' 158(1) and 158(2). Another such example is shown relative to FIG. 1I.

Figure 1H:
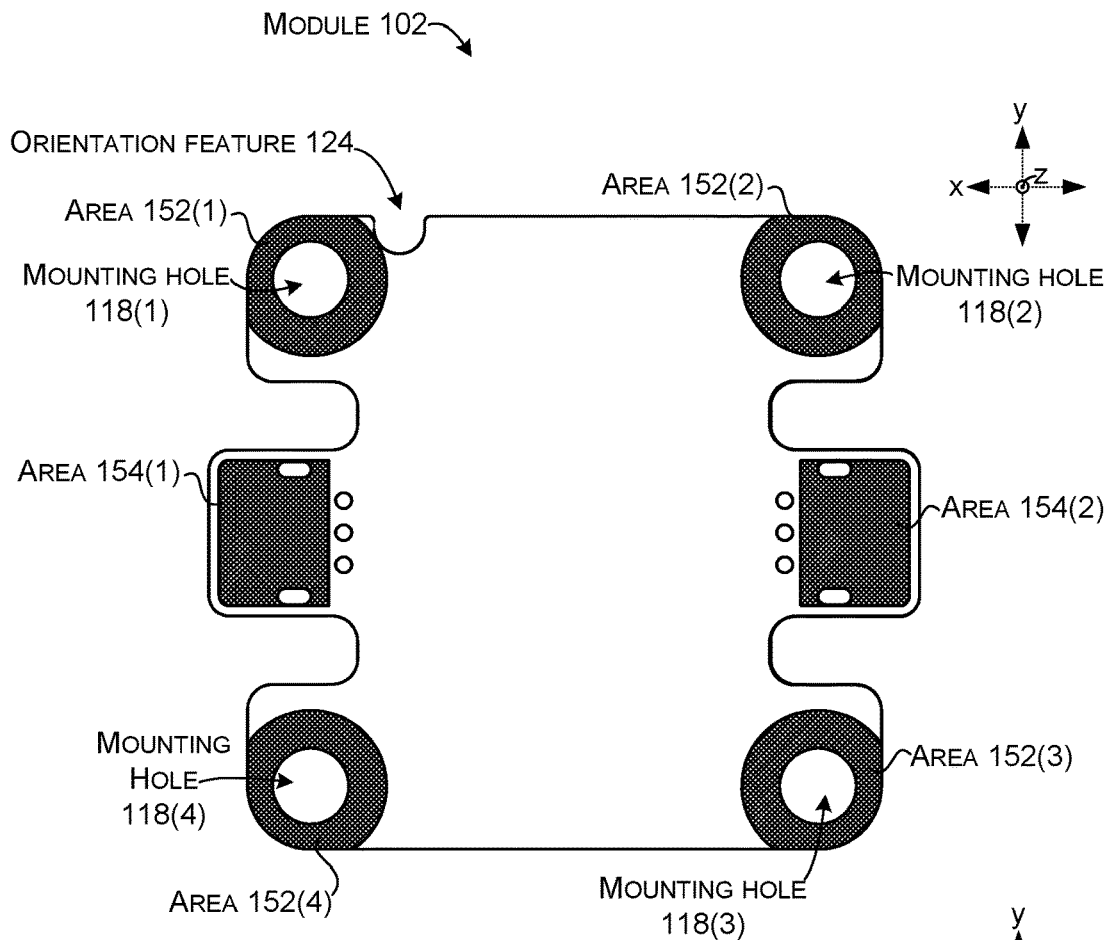

FIG. 1H shows example module 102. In some implementations, areas or zones 152 of the substrate 112 proximate to mounting holes 118 are reserved/dedicated for contacts 140

(shown in FIG. 1F). Similarly, areas or zones 154 on tabs 130 can be reserved/dedicated for contacts 136 (shown in FIG. 1F). Other conductors can be excluded or prohibited (e.g., exclusion zone or 'keep out' zone) from these areas 152 and 154 to avoid short circuits. Similarly, other layers, such as insulative layers can be excluded or prohibited to allow effective electrical contact between the fasteners 150 and the contacts 136 and/or 140 and/or the contacts and external connectors.

FIGS. 1A and 1B show a single fastener type that can provide both electrical contact and mechanical fastening. Note that this is but one of the contemplated configurations. Alternatively, multiple fastener types could be employed in a complementary manner. For instance, the illustrated fasteners could provide the electrical contact function and a spacing function between the module 102 and the breadboard 104. Another fastener type could be employed to provide mechanical fastening of the module 102 and the breadboard 104. For instance, a thinner fastener (e.g., a bolt) could be extended from above the module through a bore of the illustrated fastener and threaded into a corresponding nut positioned below the breadboard to provide mechanical fastening (in the z reference direction) of the module/breadboard assembly. Other configurations are also contemplated.

Figure 1I:
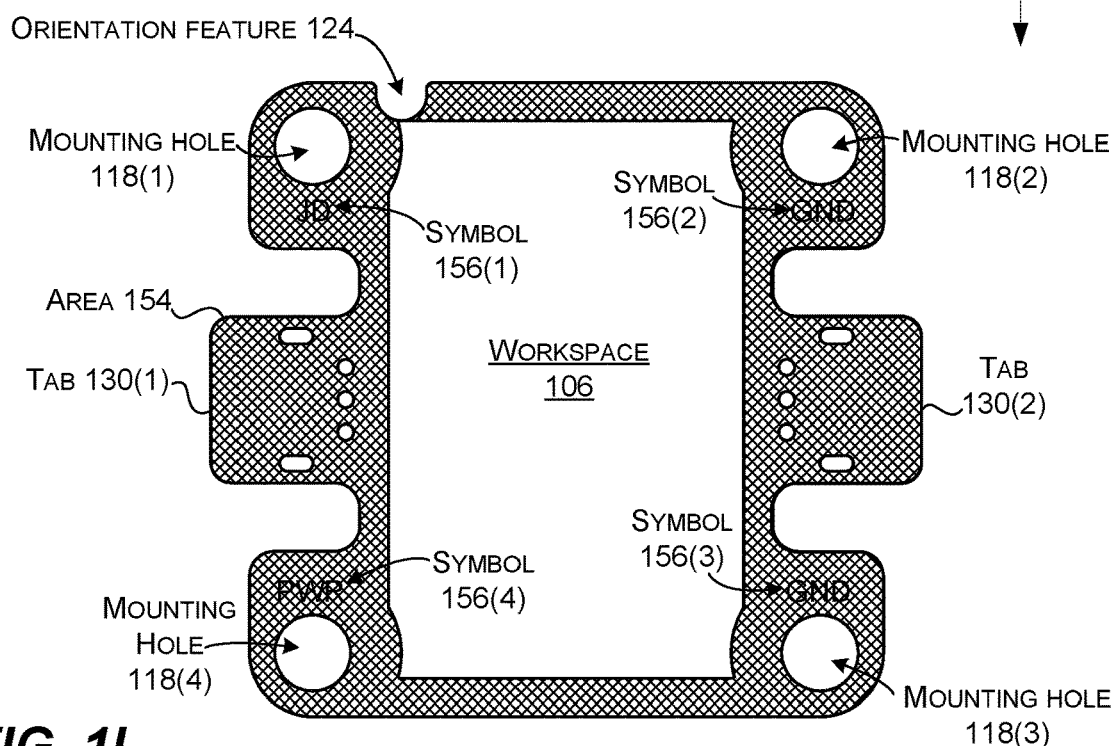

FIG. 1I shows example module 102. The workspace 106 indicates areas where components can be added to the module 102. In contrast, the 'keep out' area 154 (e.g., the area of the substrate that is not the workspace) delineates an area of the substrate where components are not allowed. The keep out area 154 can include contacts 136 (see FIG. 1F) on the tabs 130 and contacts 140 (see FIG. 1F) around the mounting holes 118.

FIG. 1I also shows symbols 156 relative to the mounting holes 118 to assist the user. In this example, symbol 156(1) is an abbreviation for data (JD), symbols 156(2) and 156(3) are abbreviations for ground (GND), and symbol 156(4) is an abbreviation for power (PWR).

In review, individual mounting holes 118 can be associated with individual buses 138. The orientation feature 124 can provide unambiguous visual guidance to which mounting hole is which (e.g., which mounting hole is associated with the data bus, which mounting hole is associated with the ground bus, and/or which mounting hole is associated with the power bus). The orientation feature 124 can provide this guidance by having a unique spatial relationship with each of the individual mounting holes 118. In this example, the unique spatial relationship is manifest in that each mounting hole 118 is located at a direction and distance from the orientation feature 124 that is different than each of the other mounting holes 118. The mounting holes can provide dual functionality of contributing to the module being physically secured to other components, such as a breadboard and electrically connecting the module to the other components.

As introduced above, and as shown in FIGS. 1A and 1B, the breadboard 104 can include mounting holes 142 that correspond to the mounting holes 118 of the modules 102. Fasteners 150 can extend through the module's mounting holes 118 into the breadboard's mounting holes 142 to both mechanically secure the module 102 to the breadboard 104 and electrically connect the module 102 to the breadboard 104. Breadboards are described in more detail below relative to FIGS. 2A and 2B as well as FIGS. 3A-3C and FIGS. 4A-4G.

The modules 102 and/or breadboards 104 can be implemented in various ways. Some implementations that are consistent with the present description are delineated by the Jacdac prototyping platform/protocol. These implementations and/or other implementations may be consistent with and/or interact with other prototyping protocols.

Figure 2A:
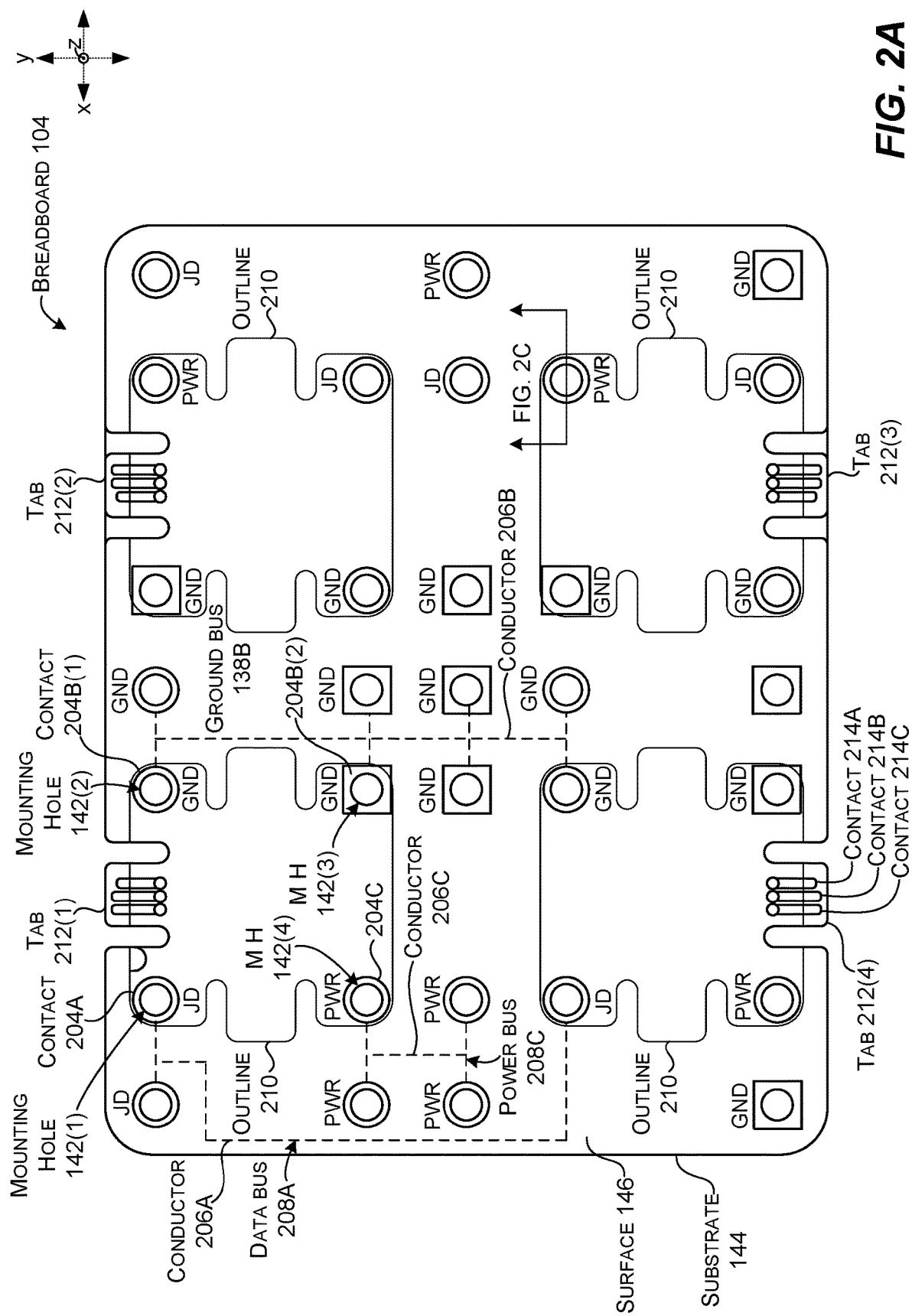
Figure 2B:
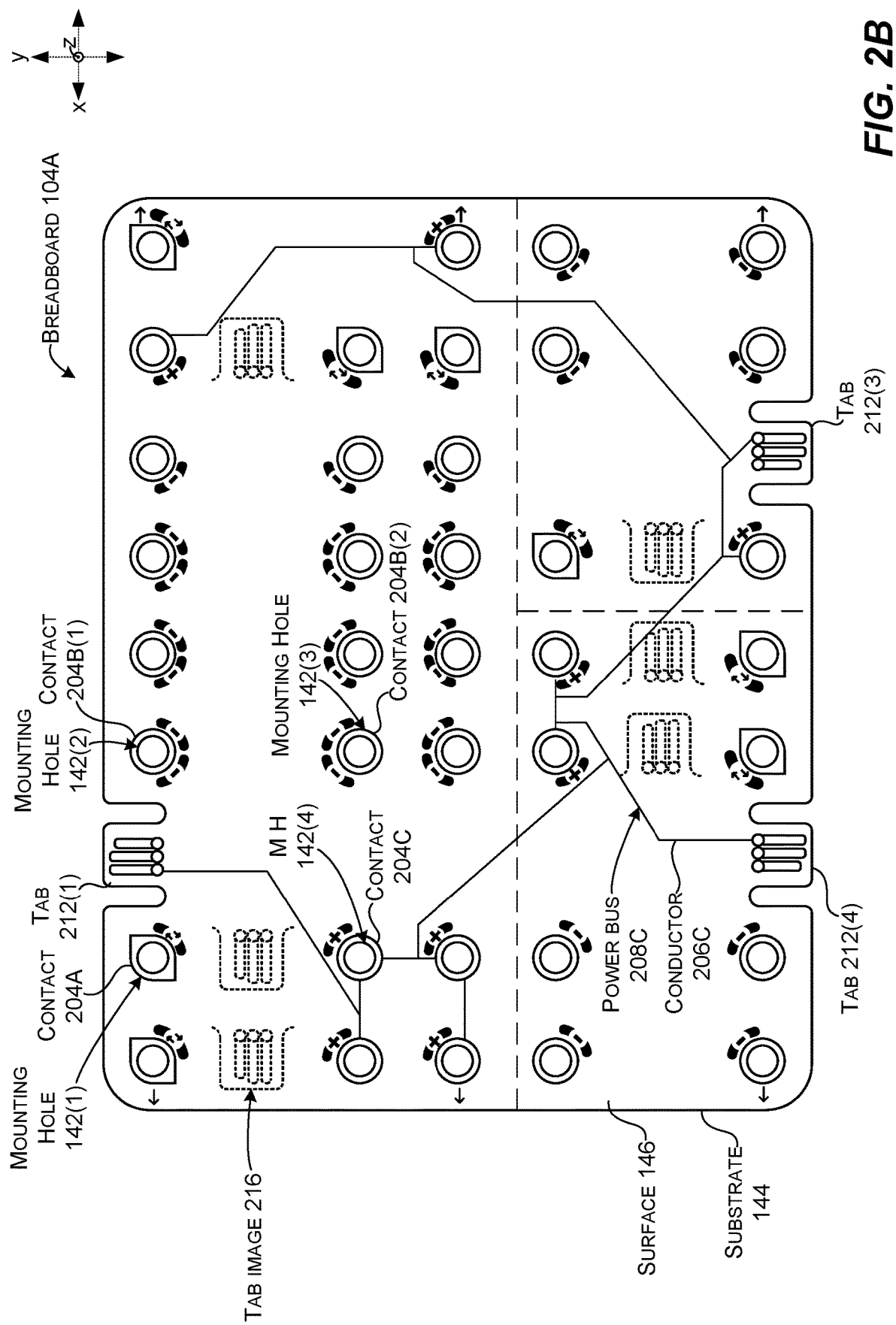

FIGS. 2A and 2B collectively show details of example breadboards. FIG. 2A shows example breadboard 104. FIG. 2B shows another example breadboard 104A. (As used in this instance, the suffix "A" is intended to indicate that breadboard 104A may have different and/or additional elements and/or configurations compared to breadboard 104).

FIG. 2A shows example breadboard 104 looking down at the first major surface 146. In this case, mounting holes 142 extend through the substrate 144 from the first major surface 146 to the second major surface 148 (not visible) of the breadboard 104.

The mounting holes 142 can be spaced apart at distances defined by and compatible with the pitch of the mounting holes of the module. Recall that in this example, the pitch is 10 mm×10 mm. As such, in this example the mounting holes 142 are positioned at 10 mm, 20 mm, and/or 30 mm, etc. intervals.

The mounting holes 142 have electrical contacts 204 proximate to them. In this case, the electrical contacts surround (e.g., circumscribe) the mounting holes 142, but other configurations are contemplated. Conductors 206 are shown connecting like mounting holes 142 to form buses 208. The conductors 206 and buses 208 are shown in ghost to indicate that they would likely not be visible in this view and would instead be obscured by insulative material, such as by substrate 144 and/or by layers positioned over the substrate.

Note that not all instances of the conductors 206 are shown in order to reduce clutter on the drawing page. Instead, a few clusters of conductors 206 are shown. The conductors 206 would actually connect all like contacts 204. For instance, all contacts 204A associated with data bus 208A would be connected by conductors 206A, all contacts 204B associated with electrical ground bus 208B would be connected by conductors 206B, and all contacts 204C associated with power bus 208C would be connected by conductors 206C. Note also that to avoid clutter on the drawing page, not all instances of the mounting holes 142 and contacts 204 are labeled with specificity. Instead, representative mounting holes and contacts are labeled.

Recall that various aspects were described above relative to the module to aid the user in properly connecting the module, such as the orientation feature 124 and the symbols 156. Similar concepts can be manifest on the breadboard 104. For instance, symbols 156 in the form of abbreviations for data (JD), ground (GND), and/or power (PWR) can be employed adjacent to individual mounting holes 142. This implementation also includes an outline 210 of the modules at several potential locations and orientations on the breadboard. Within the outline 210, the spacing and placement of mounting holes match those of the modules. For instance, the spacing is 20 mm×20 mm in this example. The outline 210 can further facilitate the user experience and reduce chances of the user inadvertently connecting mismatched mounting holes 142 of that breadboard 104 and mounting holes 118 of the modules 102.

The breadboard 104 can also include tabs 212 with contacts 214 (labeled relative to tab 212(4)) that are analogous to tabs 130 and contacts 136 of the module. The contacts 214 can be electrically connected to the buses 208 (e.g., contact 214A to bus 208A, contact 214B to bus 208B, and contact 214C to bus 208C). Tabs 212 can be accessible even when modules are positioned on the breadboard. Thus, other modules and/or devices can be electrically coupled to the buses 208 to expand the overall collective device or assembly and/or allow additional components to be added to the device.

FIG. 2B shows another example breadboard 104A. This example shows the conductors 206C connecting all of the positive contacts 204C to the power bus 208C. To avoid clutter on the drawing page, the ground and data conductors are not shown. Symbols 156 in the form of abbreviations for data (opposing arrow), ground (negative sign), and power (positive sign) are positioned proximate to each mounting hole 142 to aid the user in properly positioning and fastening modules to the breadboard so that positive (e.g., power) mounting holes are aligned with positive (e.g., power) mounting holes, negative (e.g., ground) mounting holes are aligned with negative (e.g., ground) mounting holes, and data mounting holes are aligned with data mounting holes. In this case, tab images 216 are printed on the substrate 144 to help the user with module placement. Positioning a module on the breadboard so that the tabs of the module line up with the tab images 216 will properly align the module mounting holes with the corresponding breadboard mounting holes 142 to both mechanically secure and electrically connect the module and the breadboard.

Figure 3A:
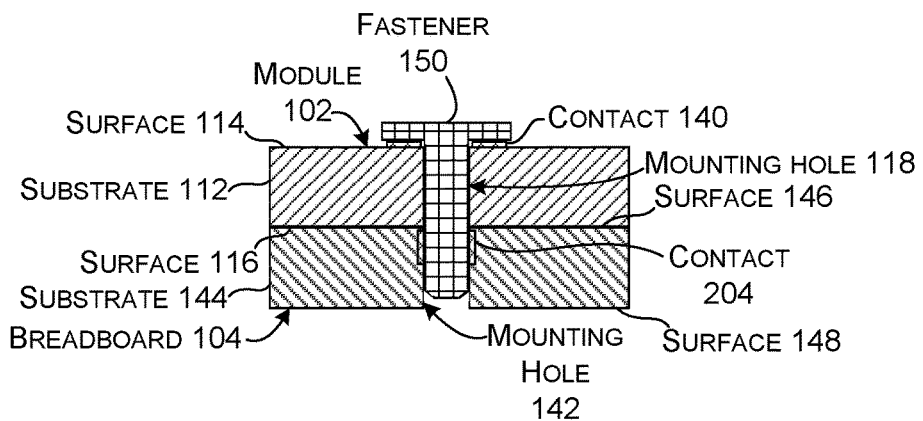
FIGS. 3A-3C, 4B, 4D, and 4F show sectional views of example devices in accordance with some implementations of the present concepts.
Figure 3B:
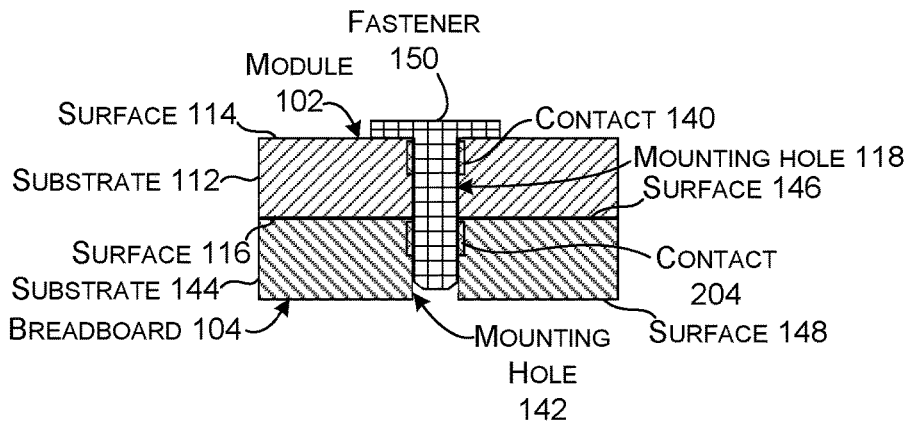
Figure 3C:
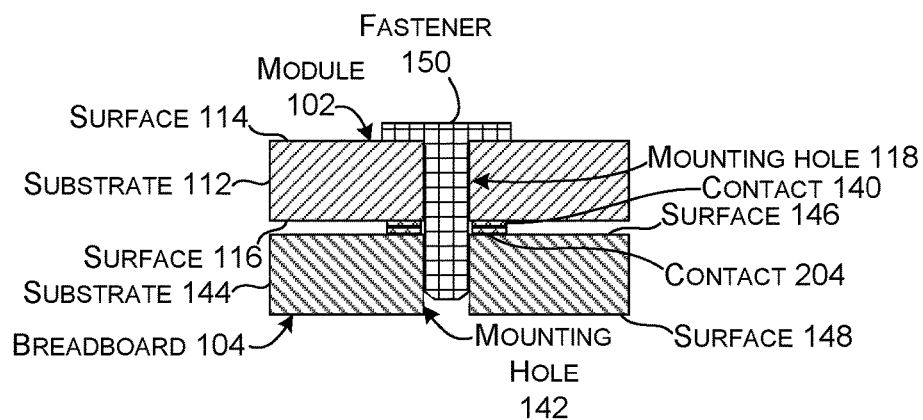

FIGS. 3A-3C collectively show several configurations for both mechanically securing and electrically connecting modules 102 to breadboards 104 via fasteners 150 extending through corresponding mounting holes 118 and 142.

In FIG. 3A mounting hole 118 is bordered by contact 140 that circumscribes the mounting hole on the first major surface 114. Similar configurations for the breadboard 104 are shown in FIGS. 2A and 2B. In this case, breadboard contacts 204 are plated through the mounting hole 142 (e.g., the conductor is positioned on an inwardly facing surface of the substrate 144). The fastener 150 can be threaded and can be threadably received in the mounting hole 142 to mechanically secure the module 102 to the breadboard 104. Alternatively, the fastener 150 can be friction fit into mounting hole 142 to retain the module 102 and the breadboard 104 together. For instance, radially biased fasteners, such as banana plugs and/or split spring-loaded push pins can be employed, among others. The fastener 150 can be formed from an electrically conductive material, such as a metal. Alternatively, the fastener can be formed from an electrically insulative material, such as a polymer that is coated with a conductive material. In either configuration, the fastener 150 can complete an electrical circuit between contact 140 of the module 102 and contact 204 of the breadboard 104 (e.g., from an individual bus, such as the power bus of the module, to a corresponding bus (e.g., power bus) of the breadboard 104). The fastener 150 can achieve this electrical connection while also mechanically securing the module 102 to the breadboard 104.

FIG. 3B shows an alternative configuration where contacts 140 are plated through mounting hole 118 and contacts 204 are plated through mounting hole 142. In this configuration, the fastener 150 completes the electrical circuit between the contacts 140 and the contacts 204. Thus, the fastener 150 can be either an electrically conductive material or coated with an electrically conductive material.

FIG. 3C shows an alternative configuration where an instance of contact 140 occurs on major surface 116 around the mounting hole 118. This contact 140 can be aligned with and directly contact the corresponding contact 204 on major surface 146 of the breadboard. The fastener 150 can maintain alignment of the contacts 140 and 204 and force them together to facilitate electrical contact while it mechanically secures the module 102 and the breadboard 104. This configuration does not rely on electrical conductivity through the fastener. As such, the fastener 150 can be electrically conductive or non-conductive.

Figure 4A:
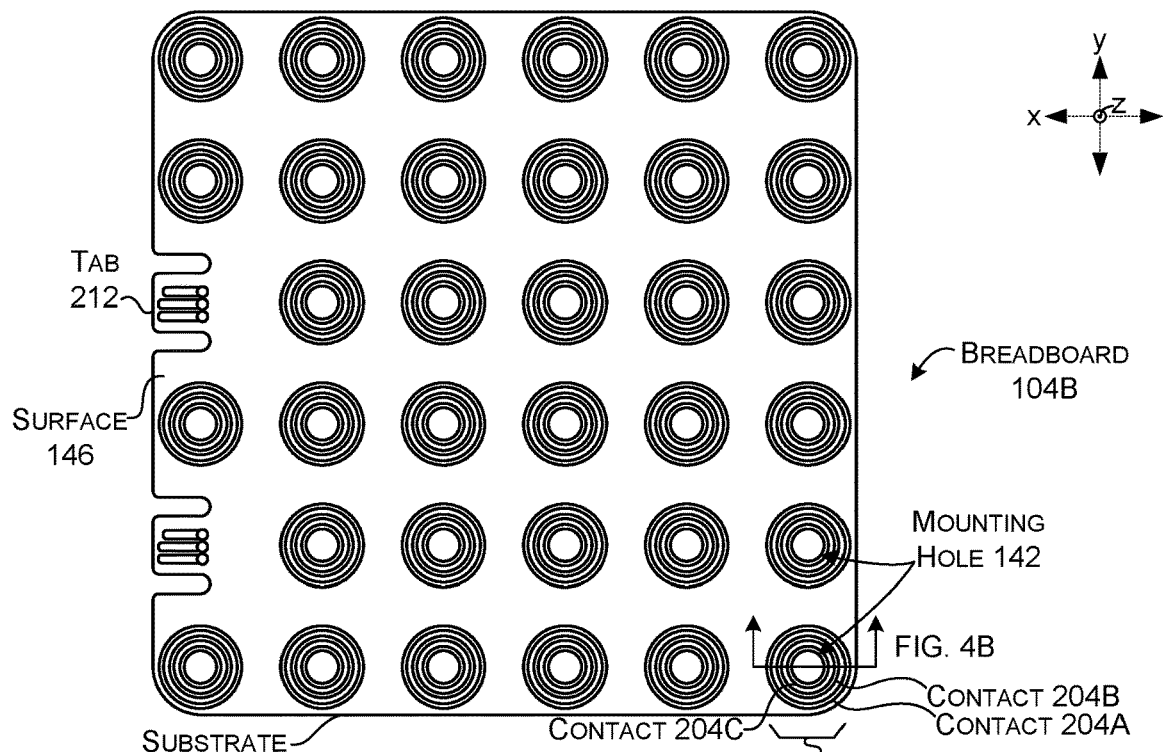
Figures 4B, 4C:
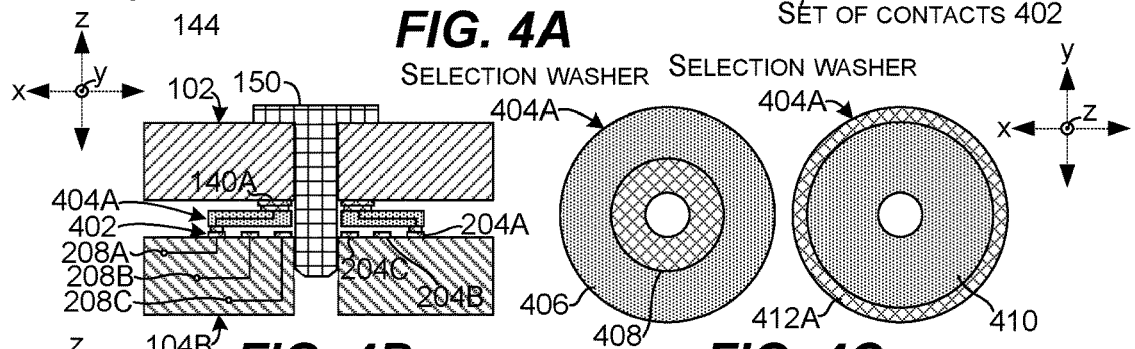
Figures 4D, 4E:
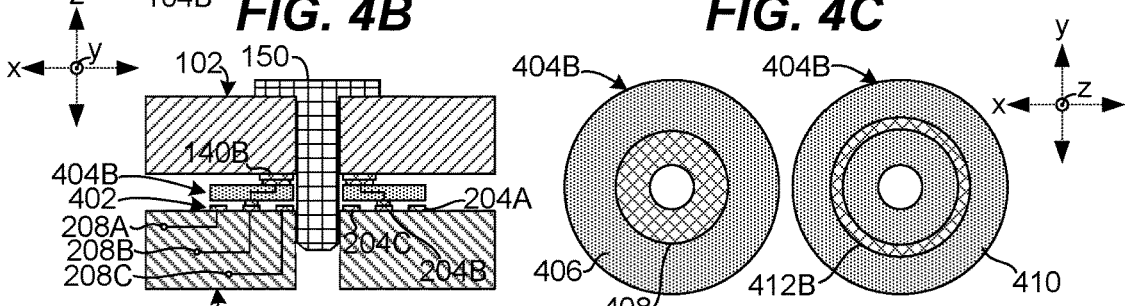
Figures 4F, 4G:
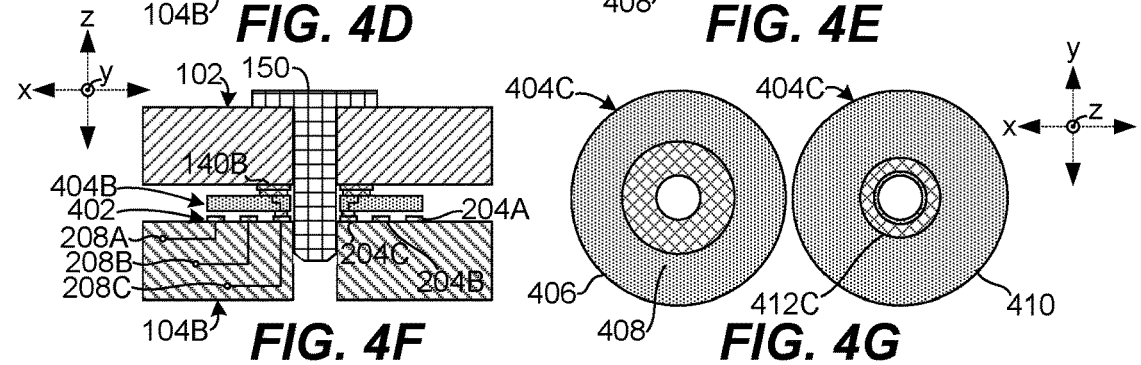

FIGS. 4A-4G collectively show another example breadboard 104B. In this case, the breadboard includes multiple mounting holes 142. The mounting holes 142 can be arranged at a given pitch, such as 10 mm (e.g., a 10 mm by 10 mm grid in both the x and y reference directions from one another center to center). In this case, each of the mounting holes 142 can be associated with a set of contacts 402 on the first major surface 146. The set of contacts can include contact 204A that is connected to the data bus 208A, contact 204B that is connected to the ground bus 208B, and power contact 204C that is connected to power bus 208C. Thus, each mounting hole 142 has the potential to be connected to the data bus, ground bus, or power bus. The selection of the individual bus can be accomplished via selection washers 404 that are positioned between the module 102 and the breadboard 104 as shown in FIGS. 4B, 4D, and 4F.

FIGS. 4B and 4C show a selection washer 404A that is configured to connect to the data bus 208A of the breadboard 104B. Note that in each of the instances described in relation to FIGS. 4B-4C, 4D-4E, and 4F-4G, a first surface 406 of the selection washer 404 that faces the module 102 is the same. The difference is on the second surface 408 that faces the breadboard 104. The first surface 406 of the selection washer 404 includes a contact 410A that is configured to touch (e.g. is similar in size and location) a contact 204 on the second surface 116 of the module 102. Assume for purposes of explanation that in this case, the contact 204 on the module is a data contact. In such a case, an individual selection washer is selected that has a contact 412A on second surface 408 that is configured to touch contact 204A (e.g., the outer contact) of the set of contacts 402. When the selection washer 404 is positioned between the module 102 and the breadboard 104 the contact 410A will complete the electrical circuit between the data bus of the module and the data bus of the breadboard.

FIGS. 4D and 4E show a second option where the contact 204 is a ground contact that is connected to the ground data bus of the module 102. In this case, an individual selection washer 404B can be selected that has the intermediate (e.g., middle) contact 412B on the second side 408. The intermediate contact 412B will complete the electrical circuit between the ground bus of the module and the ground bus of the breadboard. The fastener 150 can be installed through the mounting holes 118 and 142 to maintain the module and the breadboard against one another and at the same time maintain the electrical contact.

FIGS. 4F and 4G show a third option where the contact 204 on the module 102 is a power contact that is connected to the power bus of the module. In this case, an individual selection washer 404C can be selected that has the inner contact 412C on the second side 408. The inner contact 412C will complete the electrical circuit between the power bus of the module and the power bus of the breadboard. The fastener 150 can be installed through the mounting holes 118 and 142 to maintain the relationship between the module and the breadboard and to facilitate electrical contact between the module and the breadboard through the selected washer.

Thus, this breadboard 104B and the selection washers 404 work cooperatively with the modules 102 described above where individual mounting holes 118 of the module 102 are associated with individual buses. The set of selection washers can include three different subsets; one subset configured to contact the inner contact, but not the intermediate or outer contact, another subset configured to contact the intermediate contact, but not the inner or outer contacts, and a final subset that is configured to contact the outer contact, but not the inner contact or the intermediate contact.

The set of contacts 402 around individual mounting holes of the breadboard allow each mounting hole 142 of the breadboard 104 to accept whatever contact is positioned over it by employment of the appropriate selection washer 404A, 404B, or 404C. The thickness of the contact 412 on the washer in the z reference direction can be specified so that the contact touches the corresponding contact 402, but no other parts of the selection washer touch the other (non-selected) contacts or other parts of the breadboard 1048.

Note that in this implementation, the set of contacts 402 are nested around one another (e.g., concentric circles or rings). However, other implementations are contemplated. For instance, degrees of arc around each mounting hole 142 (as viewed relative to the z axis that is coaxial with the mounting hole) of the breadboard 104B and the selection washer 404 could be assigned to an individual bus. For instance, zero or one degrees to 120 degrees could be assigned to a first bus and associated data contact, 121 degrees to 240 degrees could be assigned to a second bus and associated ground contact, and 241 degrees through 360 degrees could be assigned to a third bus and associated power contact. In another configuration a range of degrees could be reserved to avoid short circuits. For instance, 355 degrees to 5 degrees could be reserved/dedicated for separation and 6 degrees to 115 degrees can be assigned to a first bus, 116 degrees to 125 degrees could be reserved/dedicated for separation and 126 degrees through 235 degrees could be assigned to a second bus, 236 through 245 degrees could be reserved/dedicated to separation and 246-355 could be reserved/dedicated to the third bus, for example.

Figure 5A:
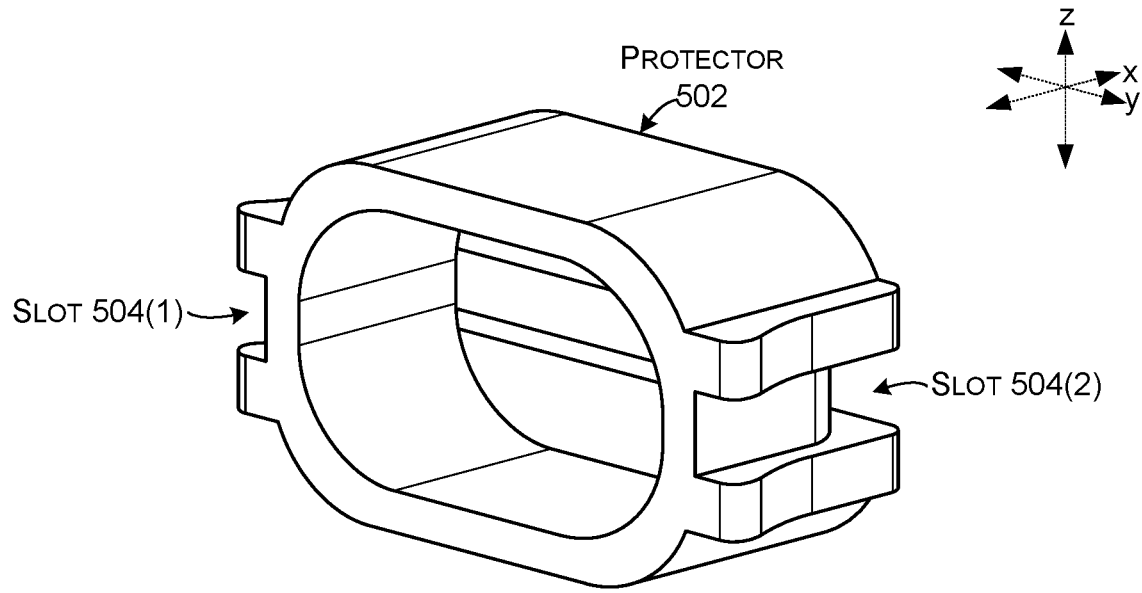
Figure 5B:
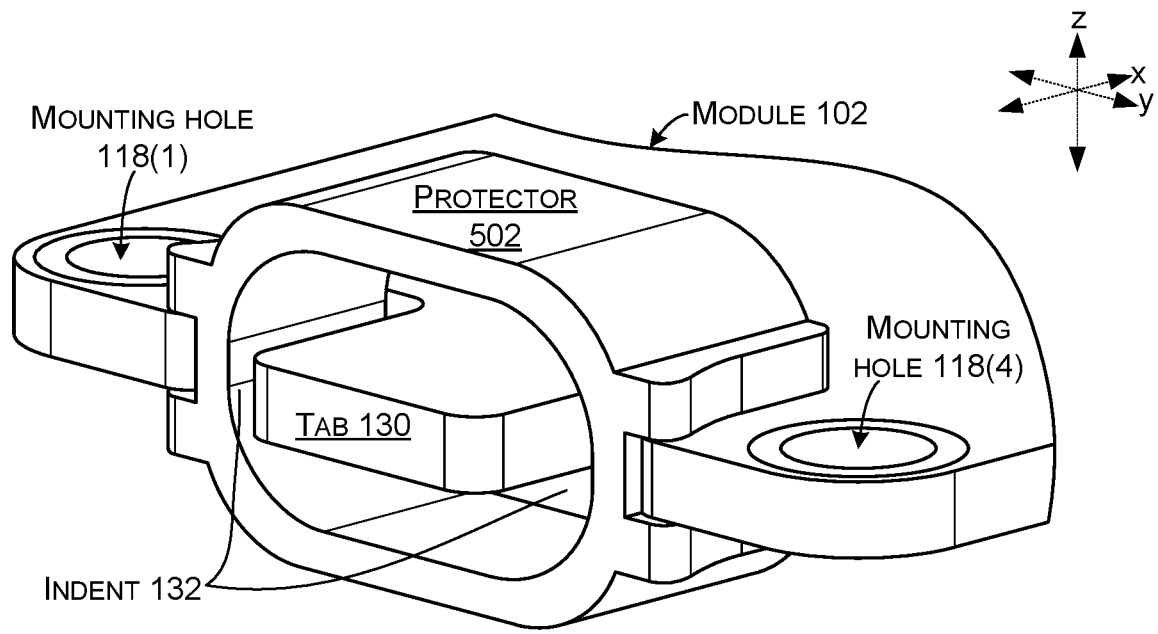

FIGS. 5A and 5B collectively show a protector 502 that can protect tabs 130. The protector 502 can protect the tab 130 and contacts on the tab without interfering with other elements of the module 102, such as the mounting holes 118. The protector 502 can also allow conductive cables to be connected to and disconnected from the tab 130 without removing the protector. The protector 502 can be maintained on the module 102 without fasteners, yet can be removed with hand pressure by a user. The protector can achieve this technical solution by sliding into the indents 132 on each side of the tabs 130. The protector 502 can define a slot that is approximately the same thickness (or, if the protector is made from a compliant material, slightly smaller) than a thickness of the substrate 112. This configuration allows the substrate to be slid into the slot and retained by friction fit.

Figure 6A:
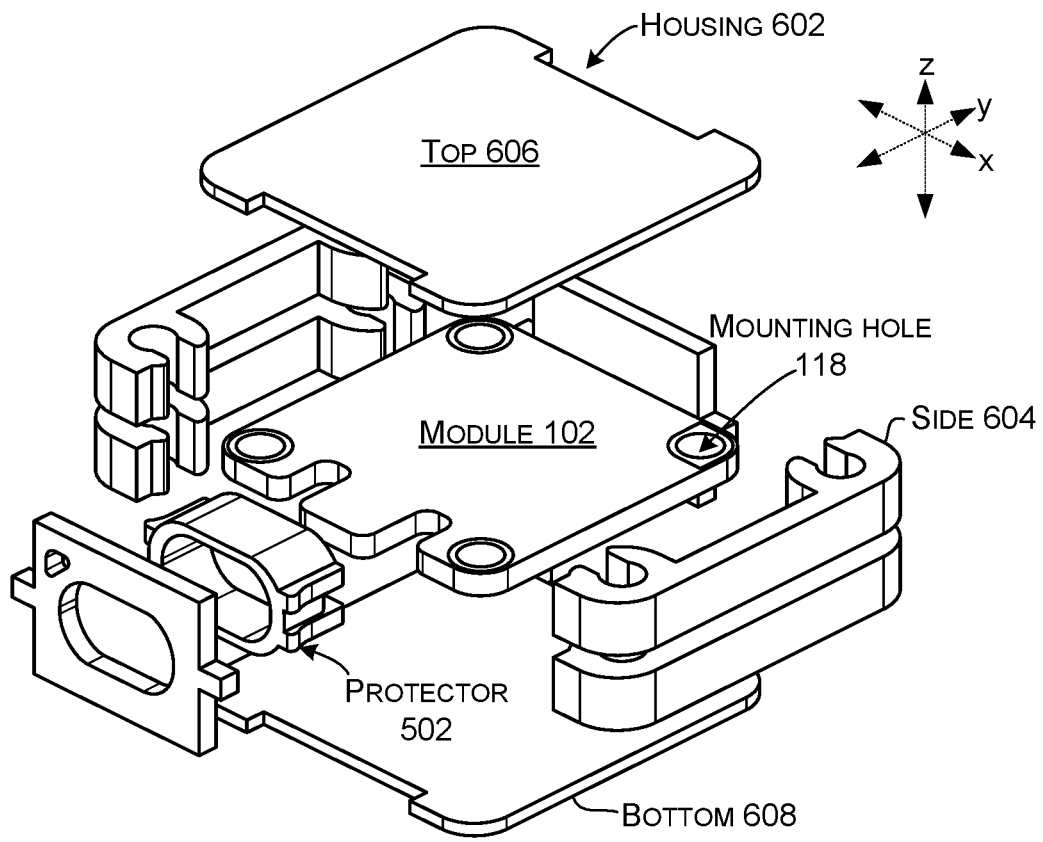
Figure 6B:
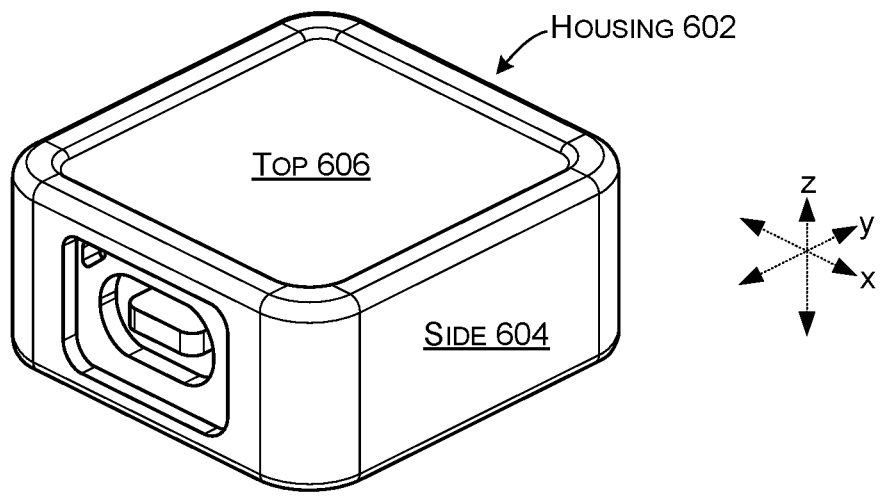

FIGS. 6A and 6B collectively show a housing 602 that can protect the module 102. For instance, the housing can protect the module from crushing forces and/or limit dust ingress and/or liquid impingement, for example. The inside dimensions of the housing can be determined by the external dimensions (e.g., the perimeter) of the module to provide a snug fit that holds the module in place. In this case, the housing can entail a compliant wraparound side 604 that receives the module and allows access to the mounting holes. A top 606 and bottom 608 engage the side 604 to complete the housing 602 around the module. The housing 602 can also work cooperatively with the protector 502 to create a sealed enclosure around the module 102 while still allowing conductive cables to be connected to tab 130.

Figure 7:
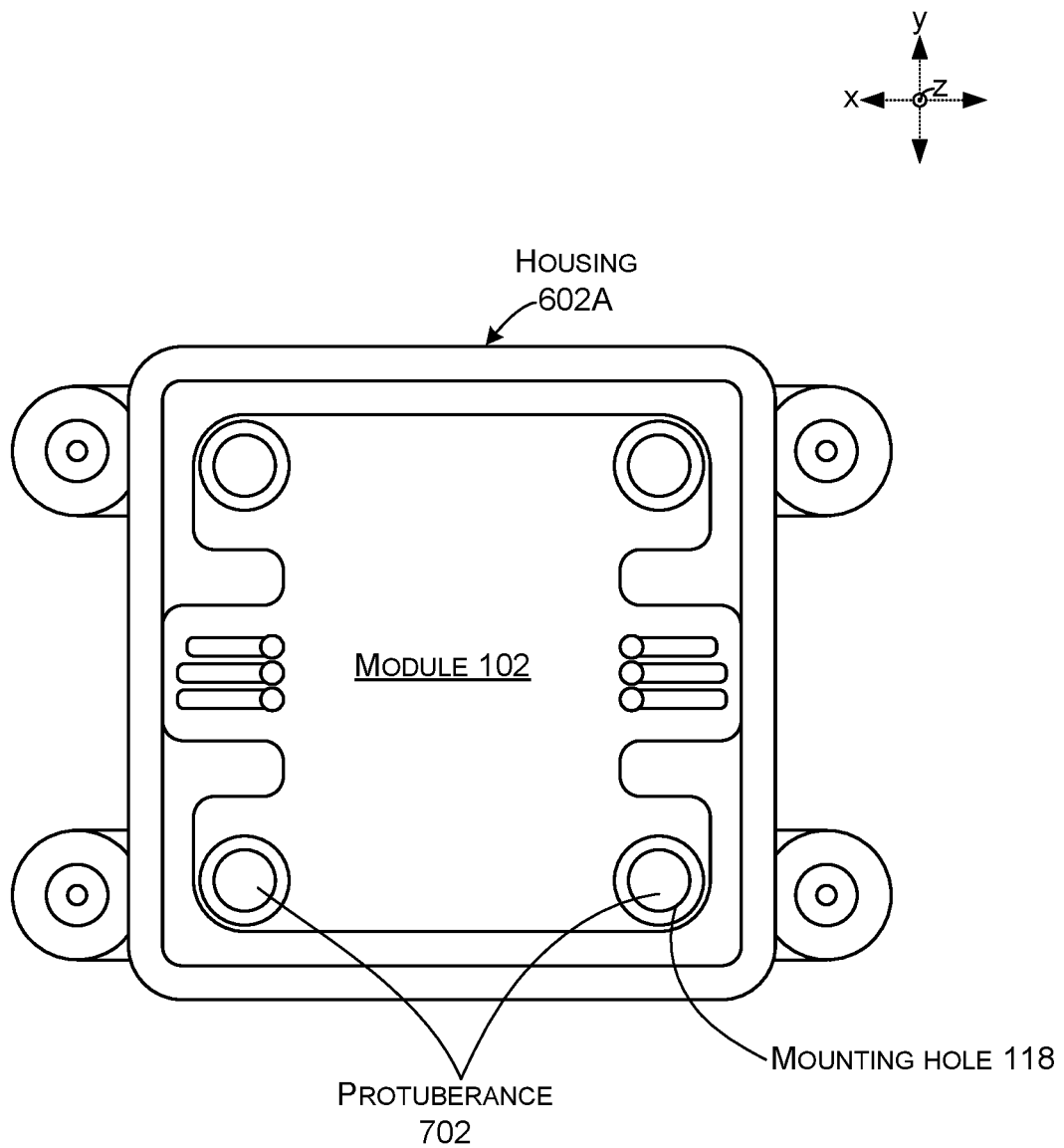

FIG. 7 shows another example housing 602A. The housing 602A can include protuberances 702 that are positioned and sized to receive the mounting holes 118 of the module 102. The housing 602A can be manifest as a single piece that receives the module 102. Alternatively, the housing 602 can entail two opposing complementary pieces (e.g., a clamshell configuration) into which the module is placed and the pieces closed against one another.

The protector 502 and the housings 602 can be formed from various materials, such as various polymers. The protectors can be formed utilizing various techniques, such as molding, 3D printing or other additive techniques, and/or machining, laser cutting, and/or other material removal techniques.

Individual elements of the modules and the breadboards can be made from various materials, such as metals, plastics, and/or composites, such as laminates. These materials can be prepared in various ways, such as from formed sheet metals, die cast metals, machined metals, 3D printed materials, molded or 3D printed plastics, and/or molded or 3D printed composites, among others, and/or any combination of these materials and/or preparations can be employed. Conductors can be formed/positioned using various formation techniques, such as lithographic techniques, trace formation techniques, etc.

Various methods of manufacture, assembly, and/or use for prototyping systems including modules and/or breadboards are contemplated beyond those shown above relative to FIGS. 1A-7.

Although techniques, methods, devices, systems, etc., pertaining to prototyping systems are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

Various examples are described above. Additional examples are described below. One example includes a device comprising an electrically insulative substrate having generally opposing first and second major surfaces, an orientation feature defined in the substrate at a non-centered location, four mounting holes defined through the substrate between the first and second major surfaces in a rectangular pattern, a first individual mounting hole having a first spatial relationship with the orientation feature and bordered by an electrical conductor associated with data transmission, a second individual mounting hole having a second spatial relationship with the orientation feature and bordered by an electrical conductor associated with electrical ground, a third individual mounting hole having a third spatial relationship with the orientation feature and bordered by an electrical conductor associated with electrical ground, and a fourth individual mounting hole having a fourth spatial relationship with the orientation feature and bordered by an electrical conductor associated with device power and each of the first spatial relationship, second spatial relationship, third spatial relationship, and fourth spatial relationship are different from one another, and an edge connector tab defined by the substrate and extending beyond a perimeter of the rectangular pattern and having three exposed electrically conductive contacts that are coupled to the data electrical conductor, the ground electrical conductor, and the power electrical conductor and insulated from one another.

Another example can include any of the above and/or below examples where the rectangular pattern is square.

Another example can include any of the above and/or below examples where sides of the square are 10 millimeters and dimensions of the substrate are 15 millimeters by 15 millimeters or wherein the sides of the square are 20 millimeters and the dimensions of substrate are 25 millimeters by 25 millimeters.

Another example can include any of the above and/or below examples where the rectangular pattern comprises longer sides that have lengths that are whole number multipliers of a length of the shorter sides, or wherein the shorter sides and the longer sides are whole number multipliers of a common pitch.

Another example can include any of the above and/or below examples where the longer sides are 20 millimeters and the shorter sides are 10 millimeters and dimensions of the substrate are 15 millimeters by 25 millimeters.

Another example can include any of the above and/or below examples where the orientation feature is a notch formed along a perimeter of the substrate.

Another example can include any of the above and/or below examples where the notch is formed proximate to the first individual mounting hole.

Another example can include any of the above and/or below examples where the edge connector comprises first and second edge connectors.

Another example can include any of the above and/or below examples where the first and second edge connectors comprise first and second opposing edge connectors.

Another example can include any of the above and/or below examples where the edge connector comprises first and second edge connectors positioned on a single side of the substrate.

Another example can include any of the above and/or below examples where the device further comprises additional edge connectors.

Another example can include any of the above and/or below examples where the first individual mounting hole is bordered by an electrical conductor that circumscribes the first individual mounting hole.

Another example can include any of the above and/or below examples where the first individual mounting hole is bordered by an electrical conductor but the electrical conductor does not extend to an inwardly facing surface that defines the first individual mounting hole.

Another example can include any of the above and/or below examples where each of the first spatial relationship, the second spatial relationship, the third spatial relationship, and the fourth spatial relationship are different from one another in both direction and distance from the orientation feature.

Another example includes a device comprising an electrically insulative substrate having generally opposing first and second major surfaces and that includes an orientation feature that is visible on both of the first and second major surfaces, four mounting holes defined through the substrate between the first and second major surfaces in a rectangular pattern, at least one individual mounting hole bordered by an electrical conductor associated with data transmission, at least one other individual mounting hole bordered by an electrical conductor associated with electrical ground, and at least one further individual mounting hole bordered by an electrical conductor associated with electrical power, and opposing edge connector tabs defined by the substrate and having three exposed electrically conductive contacts that are coupled to the data electrical conductor, the ground electrical conductor, and the power electrical conductor and insulated from one another.

Another example can include any of the above and/or below examples where the rectangular pattern has a width and a length that are multipliers of a given pitch.

Another example can include any of the above and/or below examples where the given pitch is 10 millimeters.

Another example can include any of the above and/or below examples where the electrically insulative substrate has a width equal to a width of the rectangular pattern plus ½ multiplied by the pitch and a length that is equal to a length of the rectangular pattern plus ½ multiplied by the pitch.

Another example includes a breadboard comprising an electrically insulative substrate defining multiple holes extending between first and second major surfaces, the holes spaced at a given pitch, first second and third buses positioned on the substrate and electrically insulated from one another, and a set of first second and third electrical contacts positioned on the first major surface around each of the multiple holes with each first electrical contact electrically connected to the first bus, each second electrical contact connected to the second bus, and each third electrical contact connected to the third bus.

Another example can include any of the above and/or below examples where the first second and third electrical contacts are radially arranged around the holes with 0-120 degrees dedicated to the first electrical contact, 121-240 degrees dedicated to the second electrical contact, and 241-360 degrees dedicated to the third electrical contact, or wherein the first second and third electrical contacts are radially arranged around the holes with 5-115 degrees dedicated to the first electrical contact, 125-235 degrees dedicated to the second electrical contact, and 245-355 degrees dedicated to the third electrical contact.

Another example can include any of the above and/or below examples where the first second and third electrical contacts are arranged around the holes as an inner, middle, and outer nested rings.

Another example can include any of the above and/or below examples where the breadboard further comprises a set of electrically insulative electrical washers having holes extending between opposing first and second major surfaces that are a similar size as the holes in the substrate and having an electrical contact positioned on the first major surface and a first subset of the set having an electrical contact on the second major surface that is connected through the substrate to the electrical contact on the first surface and is configured to contact only one of the inner, middle, and outer nested rings when the hole of the washer is aligned with an individual hole of the breadboard.

Another example can include any of the above and/or below examples where the breadboard further comprises a second subset of the set having an electrical contact on the second major surface that is connected through the substrate to the electrical contact on the first surface and is configured to contact only a different one of the inner, middle, and outer nested rings when the hole of the washer is aligned with an individual hole of the breadboard.

Another example can include any of the above and/or below examples where the breadboard further comprises a third subset of the set having an electrical contact on the second major surface that is connected through the substrate to the electrical contact on the first surface and is configured to contact only a remaining one of the inner, middle, and outer nested rings when the hole of the washer is aligned with an individual hole of the breadboard.

Another example includes a device comprising an electrically insulative substrate having generally opposing first and second major surfaces and that includes an orientation feature that is visible on both of the first and second major surfaces, a first mounting hole through the substrate that is bordered by a first electrical conductor associated with data transmission, a second mounting hole through the substrate that is bordered by a second electrical conductor associated with electrical ground, and a third mounting hole through the substrate that is bordered by a third electrical conductor associated with electrical power, and an edge connector tab defined by the substrate and having three exposed electrically conductive contacts that are coupled to the data electrical conductor, the ground electrical conductor, and the power electrical conductor and insulated from one another.

Another example can include any of the above and/or below examples where the electrically insulative substrate is rectangular shaped or wherein the electrically insulative substrate is not rectangular shaped.

Another example can include any of the above and/or below examples where the first mounting hole the second mounting hole and the third mounting hole collectively define a right angle.

Another example can include any of the above and/or below examples where the device further comprises an exclusion zone around the first mounting hole where electronics connected to the second mounting hole or the third mounting hole are prohibited.

Another example can include any of the above and/or below examples where the device further comprises a naming space on the substrate having a position and orientation that is determined by the orientation feature.

Another example can include any of the above and/or below examples where the device further comprises a symbol proximate to each of the mounting holes to identify a bus associated with each of the mounting holes.

The invention claimed is:

1. A device, comprising:
an electrically insulative substrate having generally opposing first and second major surfaces;
an orientation feature defined in the substrate at a non-centered location;
four mounting holes defined through the substrate between the first and second major surfaces in a rectangular pattern, a first individual mounting hole having a first spatial relationship with the orientation feature and bordered by an electrical conductor associated with data transmission, a second individual mounting hole having a second spatial relationship with the orientation feature and bordered by an electrical conductor associated with electrical ground, a third individual mounting hole having a third spatial relationship with the orientation feature and bordered by an electrical conductor associated with electrical ground, and a fourth individual mounting hole having a fourth spatial relationship with the orientation feature and bordered by an electrical conductor associated with device power and each of the first spatial relationship, second spatial relationship, third spatial relationship, and fourth spatial relationship are different from one another; and,
an edge connector tab defined by the substrate and extending beyond a perimeter of the rectangular pattern and having three exposed electrically conductive contacts that are coupled to the data electrical conductor, the ground electrical conductor, and the power electrical conductor and insulated from one another.

2. The device of claim 1, wherein the rectangular pattern is square.

3. The device of claim 2, wherein sides of the square are 10 millimeters and dimensions of the substrate are 15 millimeters by 15 millimeters or wherein the sides of the square are 20 millimeters and the dimensions of substrate are 25 millimeters by 25 millimeters.

4. The device of claim 1, wherein the rectangular pattern comprises longer sides that have lengths that are whole number multipliers of a length of the shorter sides, or wherein the shorter sides and the longer sides are whole number multipliers of a common pitch.

5. The device of claim 4, wherein the longer sides are 20 millimeters and the shorter sides are 10 millimeters and dimensions of the substrate are 15 millimeters by 25 millimeters.

6. The device of claim 1, wherein the orientation feature is a notch formed along a perimeter of the substrate.

7. The device of claim 6, wherein the notch is formed proximate to the first individual mounting hole.

8. The device of claim 1, wherein the edge connector comprises first and second edge connectors.

9. The device of claim 8, wherein the first and second edge connectors comprise first and second opposing edge connectors.

10. The device of claim 8, wherein the edge connector comprises first and second edge connectors positioned on a single side of the substrate.

11. The device of claim 8, further comprising additional edge connectors.

12. The device of claim 1, wherein the first individual mounting hole is bordered by an electrical conductor that circumscribes the first individual mounting hole.

13. The device of claim 12, wherein the first individual mounting hole is bordered by an electrical conductor but the conductor does not extend to an inwardly facing surface that defines the first individual mounting hole.

14. The device of claim 1, wherein each of the first spatial relationship, the second spatial relationship, the third spatial relationship, and the fourth spatial relationship are different from one another in both direction and distance from the orientation feature.

15. A device, comprising:
an electrically insulative substrate having generally opposing first and second major surfaces and that includes an orientation feature that is visible on both of the first and second major surfaces;
four mounting holes defined through the substrate between the first and second major surfaces in a rectangular pattern, at least one individual mounting hole bordered by an electrical conductor associated with data transmission, at least one other individual mounting hole bordered by an electrical conductor associated with electrical ground, and at least one further individual mounting hole bordered by an electrical conductor associated with electrical power; and,
opposing edge connector tabs defined by the substrate and having three exposed electrically conductive contacts that are coupled to the data electrical conductor, the ground electrical conductor, and the power electrical conductor and insulated from one another.

16. The device of claim 15, wherein the rectangular pattern has a width and a length that are multipliers of a given pitch.

17. The device of claim 16, wherein the given pitch is 10 millimeters.

18. The device of claim 16, wherein the electrically insulative substrate has a width equal to a width of the rectangular pattern plus ½ multiplied by the pitch and a length that is equal to a length of the rectangular pattern plus ½ multiplied by the pitch.

19. A breadboard, comprising:
- an electrically insulative substrate defining multiple holes extending between first and second major surfaces, the holes spaced at a given pitch;
- first second and third buses positioned on the substrate and electrically insulated from one another; and,
- a set of first second and third electrical contacts positioned on the first major surface around each of the multiple holes with each first electrical contact electrically connected to the first bus, each second electrical contact connected to the second bus, and each third electrical contact connected to the third bus.

20. The breadboard of claim 19, wherein the first second and third electrical contacts are radially arranged around the holes with 1-120 degrees dedicated to the first electrical contact, 121-240 degrees dedicated to the second electrical contact, and 241-360 degrees dedicated to the third electrical contact, or wherein the first second and third electrical contacts are radially arranged around the holes with 5-115 degrees dedicated to the first electrical contact, 125-235 degrees dedicated to the second electrical contact, and 245-355 degrees dedicated to the third electrical contact.

* * * * *